United States Patent [19]

Schwartz et al.

[11] Patent Number: 4,754,230

[45] Date of Patent: Jun. 28, 1988

[54] COMPANDORIZED SYSTEM CLIPPING SUPPRESSING ARRANGEMENT

[75] Inventors: Lee J. Schwartz; Michael A. Williams, both of San Diego, Calif.

[73] Assignee: HM Electronics, Inc., San Diego, Calif.

[21] Appl. No.: 31,432

[22] Filed: Mar. 27, 1987

[51] Int. Cl.$^4$ .............................................. H03G 7/08
[52] U.S. Cl. .................................... 330/279; 330/131; 333/14
[58] Field of Search ............... 330/129, 131, 278, 279; 333/14; 381/106; 455/72

[56] References Cited

U.S. PATENT DOCUMENTS 4,398,157  8/1983  Dieterich ........................ 381/106 X Primary Examiner—Eugene R. Laroche
Assistant Examiner—Steven J. Mottola
Attorney, Agent, or Firm—Bernard L. Kleinke

[57] ABSTRACT

The clipping suppression arrangement for a compandorized communication system, includes a limiter peak level detector for causing the gain of an input amplifier to be reduced quickly when a compressed output is driven toward a clipping output condition.

18 Claims, 3 Drawing Sheets

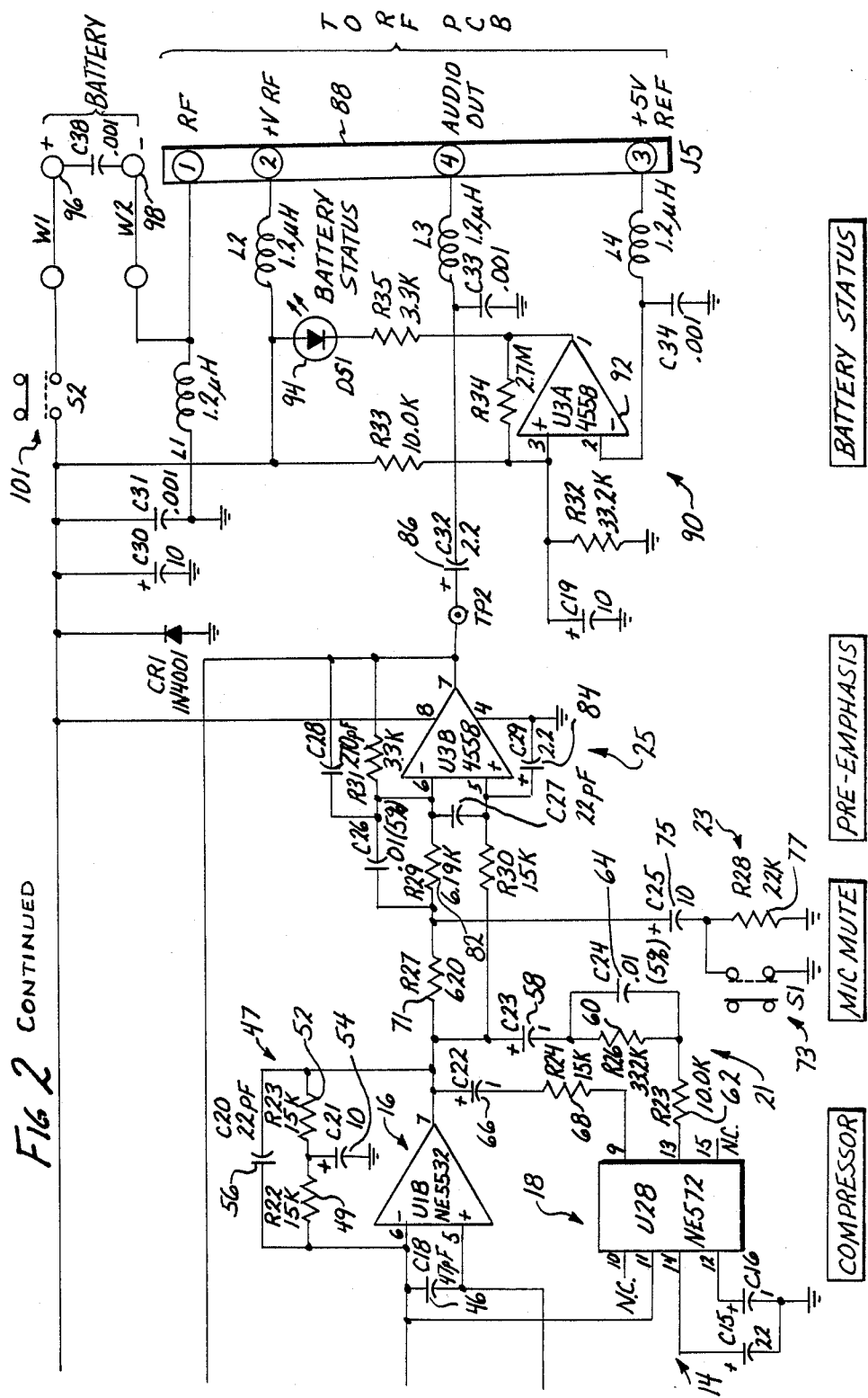

COMPANDORIZED SYSTEM CLIPPING SUPPRESSING ARRANGEMENT

DESCRIPTION

1. Technical Field

The present invention relates in general to an improved compandorized communication system arrangement, and it more particularly relates to a clipping suppression arrangement for a compandorized system.

2. Background Art

The typical conventional method of suppressing leading edge clipping in a communication system, such as a wireless microphone system, is to include a limiter-compressor circuit in a compandor arrangement. The basic drawback of this arrangement, is degradation of the sound quality resulting from the expanded dynamic range of the compressor, and the simultaneous compressed dynamic range of the limiter. Thus, the limiter is operating in opposition to the compressor, and such resulting overall operation is not always entirely satisfactory.

A typical compandor circuit has an attack time, which is the time required to reduce the gain of the compressor with a step increase in input level. Such attack time is equivalent to many cycles of a typical input signal.

Thus, for example, when a relatively low amplitude signal is supplied to the input of a wireless microphone system, the compressor operates at a relatively high gain. However, when a high level transient signal appears at the microphone input, such as when a user "pops his or her P's", or when keys are jingled near the microphone, the compressor gain starts to decrease gradually during the duration of the transient, and then commences the recovery phase when the transient signal fades. Because of the slow attack time of the compressor, its gain remains relatively high during the transient phase. Meanwhile, the high level transient signal feeds a high gain amplifier and causes its output signal to be clipped. As soon as the audio signal is clipped, distortion occurs, and the sound quality cannot be restored by post-processing. Thus, for example, the jingling keys would sound similar to glass breaking, when using compandorized equipment.

Some solutions have been attempted to maintain good sound quality, even under such extreme input signal conditions. One attempted solution was to reduce the attack time of the compressor to allow it to detect the transient input signals. However, this attempted solution presents several problems, and thus has not been entirely satisfactory. For example, in order to minimize the undesirable effects, the compandor gain should respond to an average audio signal level, rather than to the peak signal level. This desired result is not achieved by the reduced attack time, and by the slow recovery of the compressor gain, which causes the compandor gain to respond to the audio signal peak level, rather than to the average audio level of the signal.

When employing a reduced attack time of the compressor, with a relatively low level input signal being normally supplied to the input of the microphone, the compressor operates at a relatively high gain level, and the expandor operates at a relatively low gain level. When a high level transient signal appears at the input of the microphone, the compressor gain level almost instantly decreases to a low level, and the expandor gain simultaneously, almost instantly, increases to a high level. When the transient signal fades, the input signal resumes the relatively low level that prevailed prior to the appearance of the transient signal. However, due to the slow recovery time of the compandor, the gain levels of the compressor and the expandor are maintained at about the same levels as those during the span of the transient signal.

In this respect, the compressor gain is maintained at a relatively low level, and the compressor output level is low. If a limited dynamic range channel exists between the compressor and expandor as is typically the case, the expandor input signal has a poor signal-to-noise ratio, and the expandor gain remains high. The output signal of the expandor follows its input signal, with a high floor noise level. During the recovery period, the gain levels of the compressor and the expandor return to the original levels prevailing before the occurrence of the transient signal. Thus, the level of the floor noise drops. Such drop in the floor noise level simulates undesirable "sigh" or "breathing" sounds.

If the time constants are set so that the compandor gain responds to the average level, the transient signal is not detected by the gain-control circuits, but it may be clipped. Therefore, the attempted solution of having a substantially instantaneous attack, slow recovery time compandor, has not been entirely satisfactory for some applications, due to the clipping concern of the input signal, caused by the input high level transient signal.

Another attempted solution of the prior art has been to speed up the recovery time of the compressor, while maintaining a substantially instantaneous attack time. When a low frequency input signal is applied to the compressor, the recovery time of the compressor may be shorter than one cycle of the low frequency input signal. The low frequency input signal then appears on the gain-control voltage, and causes the gain to vary with the input wave form, rather than the envelope of the input wave form. Therefore, the input signal becomes modulated by itself, and generates even-harmonic distortion. If such distortion is to be avoided, the recovery time of the compressor should be made a function of the lowest input audio frequency. Hence, this attempted solution has proven to be far less than satisfactory for many applications.

Heretofore, all the attempted solutions of the prior art have been unsuccessful in overcoming both the transient clipping problem, and the poor signal-to-noise problem. Therefore, it would be highly desirable to have such a new and improved clipping suppression arrangement for a compandorized communication system, which eliminates, if not substantially overcomes, the signal-to-noise problem, as well as the distortion problem caused by the leading edge clipping of the input signal.

DISCLOSURE OF INVENTION

Therefore, the principal object of the present invention relates to a compandorized system clipping suppression arrangement, which eliminates, if not substantially overcomes, the signal-to-noise problem, as well as the distortion problem caused by the leading edge clipping of the input signal.

Briefly, the above and further objects of the present invention are realized by providing a compandorized system clipping suppression arrangement, which not only avoids the leading edge clipping problem, but also avoids the low signal-to-noise level problem.

The clipping suppression arrangement for a compandorized communication system, includes a limiter peak level detector for causing the gain of an input amplifier to be reduced quickly when a compressed output is driven toward a clipping output condition.

Thus, when a transient input signal or other input signal occurs which drives the compressor toward a clipping condition, the limiter peak level detector responds to the condition and reduces the gain of the input amplifier to prevent clipping of the output signal, and to allow the compressor to recognize the condition and make the necessary correction within the compressor's attack time. Therefore, a correction occurs to suppress the clipping, at a favorable signal-to-noise ratio.

BRIEF DESCRIPTION OF DRAWINGS

The above mentioned and other objects and features of this invention and the manner of attaining them will become apparent, and the invention itself will be best understood by reference to the following description of an embodiment of the invention in conjunction with the accompany drawings, wherein:

FIG. 3 is a series of graphs useful in understanding the operation of the arrangement of FIG. 1.

BEST MODE FOR CARRYING OUT THE INVENTION

Figure 1:
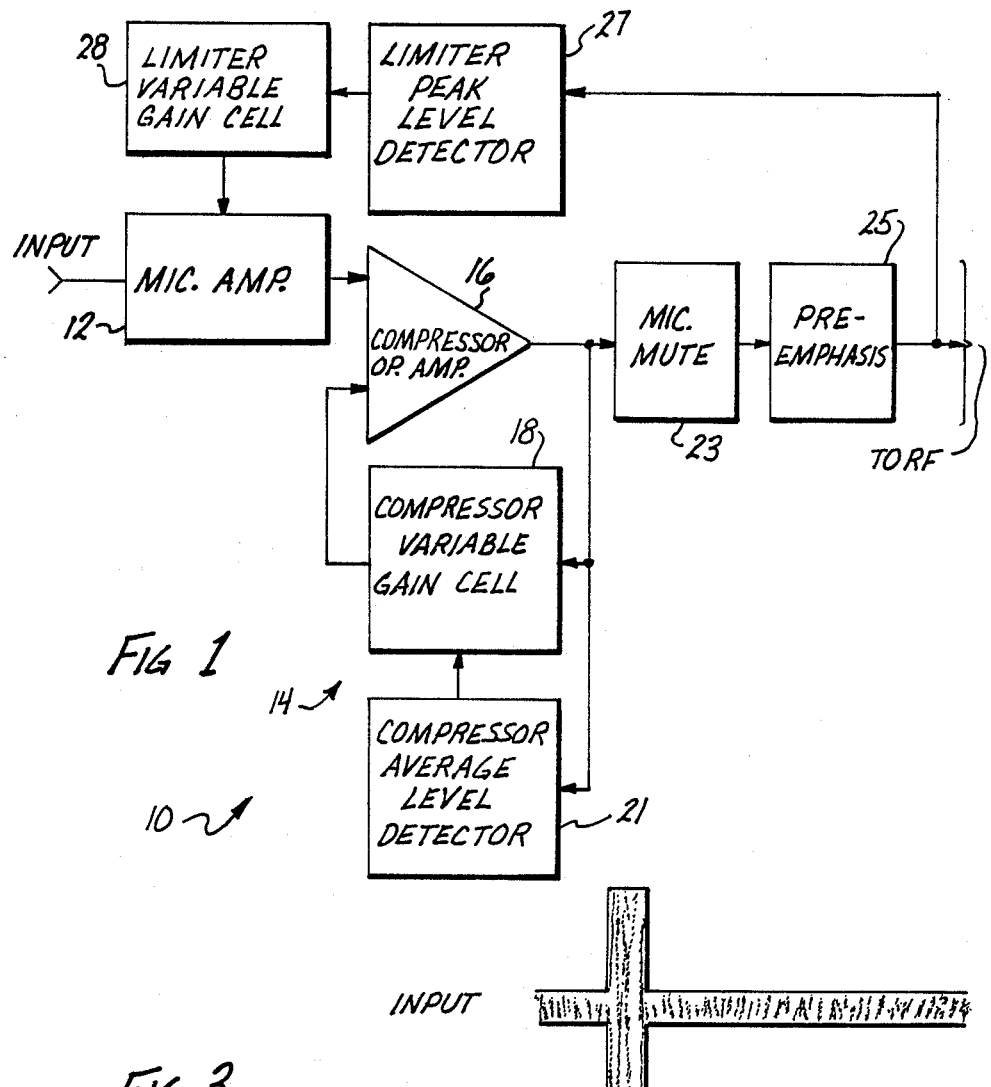
FIG. 1 is a block diagram of the compandorized communication system clipping suppression arrangement, which is constructed according to the present invention.

Referring now to FIG. 1 of the drawings, there is shown a compandorized communication system clipping suppression arrangement 10, which is constructed in accordance with the present invention. In the preferred form of the present invention, the arrangement 10 forms a part of a compandorized communication system of a wireless microphone (not shown). In this regard, the input to the arrangement 10 is from a microphone element (not shown) which generates an electrical signal from a sound emitted nearby. The output of the arrangement 10 is supplied to an RF transmitter (not shown) for communication to a remotely located receiver (not shown).

While the arrangement 10 may be suitable for use in a wireless microphone communication system, it may be used in other types of compandorized communication systems, as will become apparent to those skilled in the art.

The arrangement 10 generally comprises a microphone input amplifier 12, which amplifies the input signal from the microphone element (not shown), and supplies the amplified signal to the input of a compressor, which is generally indicated at 14. The compressor 14 includes a compressor operational amplifier 16 which responds to the amplified input signal to cause a two-to-one compression. For this purpose, the output of the operational amplifier 16 is fed back to a compressor variable gain cell 18 which is controlled by a compressor average level detector 21. In this regard, the average level detector 21 responds to the compressed output of the compressor operational amplifier 16 to average it, and then cause the variable gain cell 18 to provide a two-to-one reduction in the gain, thereby causing the compression to occur.

A normally-closed microphone mute circuit 23 conveys the compressed signal to a pre-emphasis circuit 25, which improves the signal-to-noise ratio, before supplying the resulting output signal to the RF transmitter. Thus, during normal operation, the output of the microphone amplifier 25 is compressed, and after the pre-emphasis circuit 25 conditions the compressed signal, the conditioned compressed signal is supplied to the RF transmitter. However, should a transient high amplitude signal occur at the input to the microphone amplifier 12, a limiter peak level detector 27 responds to the output of the pre-emphasis circuit 25 to cause a limiter variable gain cell 28 to reduce the gain of the microphone input amplifier 12 in a rapid manner, before the attack interval of the compressor 14 can respond to correct the condition.

The clipping can occur in the compressor 14, as well as in the pre-emphasis amplifier circuit 25. The amplifier circuit 25 is adapted to counteract a noise to improve the signal-to-noise ratio. In so doing, clipping can occur.

Considering now an example of clipping occurring in the compressor 14, assume that the input to the compressor operational amplifier 16 changes abruptly from −10 volts to approximately ground or 0 potential, as a result of an abruptly occurring transient input signal. Due to the abruptness of the excursion, the attack time of the compressor 14 does not allow it to respond to such an excursion, and thus the output of the amplifier 16 increases momentarily to ground potential.

Therefore, a 10 db gain occurs substantially instantaneously, before the compressor average level detector 21 can function.

Since a 10 db gain has occurred, the two-to-one gain of the compressor 14 tends to drive the output of the operational amplifier 16 to +5 volts. However, the compressor 14 is unable to provide such a positive going excursion, due to its internal limits. Thus, a clipping of the output signal would otherwise occur, but for the clipping suppression arrangement 10.

When such a situation occurs, the limiter peak level detector 27 responds to the reference level of ground potential being reached at the output of the pre-emphasis circuit 25, to cause the microphone input amplifier gain to be reduced accordingly, via the limiter variable gain cell 28, in a negative feedback manner. Therefore, by reducing the gain of the input amplifier, in a rapid manner, clipping of the output signal of the compressor operational amplifier 16 is prevented, even before the average level detector 21 is able to respond to the output of the operational amplifier 16.

In this manner, the pre-emphasis amplifier circuit 25 provides the arrangement 10 with a favorable signal-to-noise ratio, and yet clipping, which might otherwise occur at either the compressor 14 or the pre-emphasis amplifier circuit 25, is suppressed.

It should be understood that without the arrangement 10, should clipping occur, the overall result is that harmonics occur, and thus the signal at the receiver (not shown) would be distorted. Such distortion can not be compensated for, and produces a highly undesirable affect, when the signal is reproduced by the receiver.

As shown in FIG. 3, a transient input signal is illustrated. The compressor gain is also illustrated, when the transient occurs, a transition in the compressor gain takes place. However, the limiter gain enables the compressed output to favorable compensate it.

Figure 2:
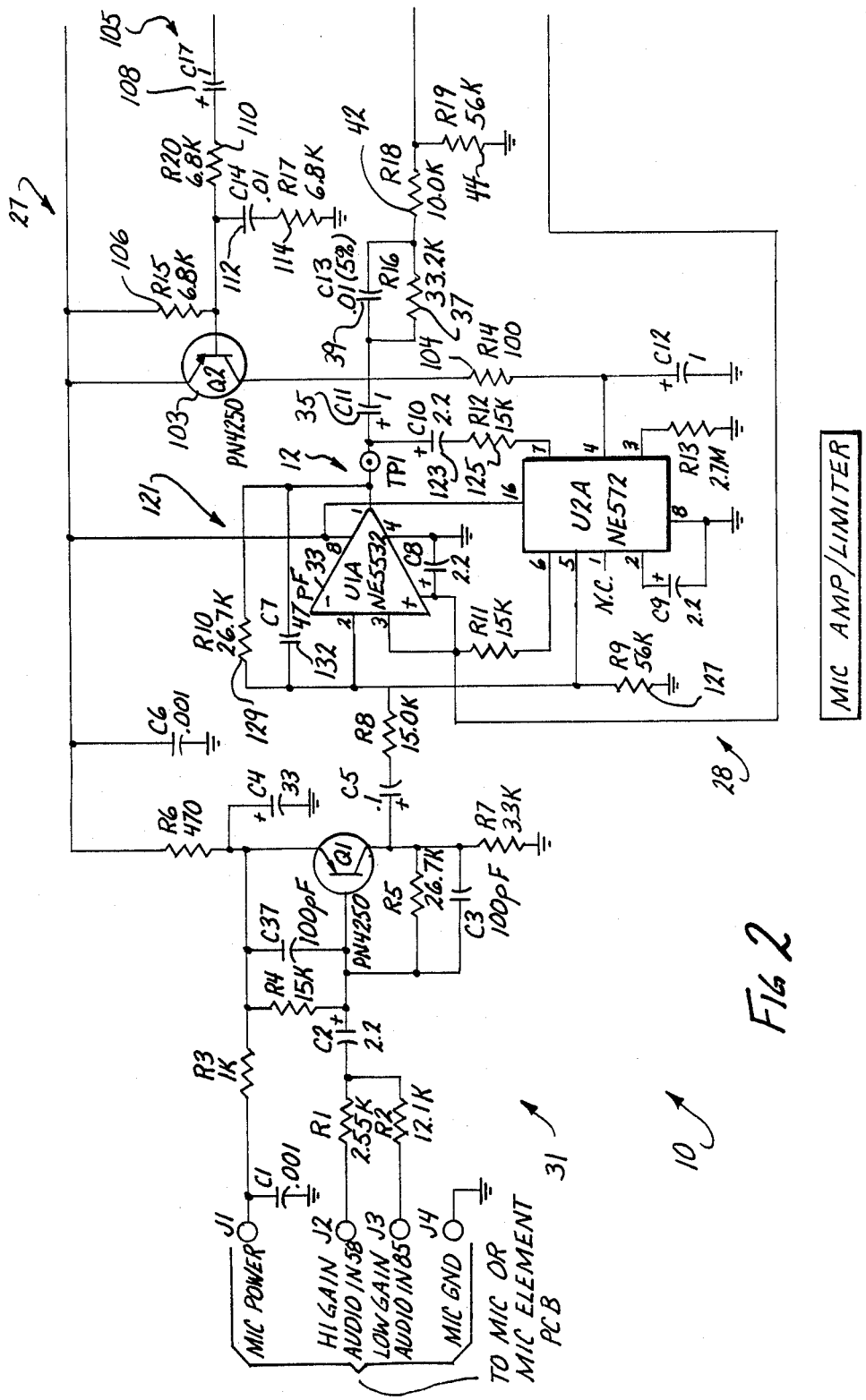
FIG. 2 is a schematic circuit diagram of the arrangement of FIG. 1.

Referring now to FIG. 2, an input circuit 31 conveys the input signal from a microphone or a microphone element (not shown) to the input of the microphone input amplifier 12. The amplifier 12 includes an operational amplifier 33. A capacitor 35 connects the output of the operational amplifier 33 through a parallel combination of a resistor 37 and a capacitor 39 through a resistor 42 to the negative terminal of the operational amplifier 16. A resistor 44 is connected from the negative terminal to ground potential. For reference purposes, the plus terminal of the compressor operational amplifier 16 is connected directly to the positive reference terminal of the input operational amplifier 33. A capacitor 46 is connected across the two input terminals of the compressor operational amplifier 16.

An impedance circuit generally indicated at 47 is connected across the output terminal of the compressor operational amplifier 16 and its negative input, for controlling the gain of the amplifier 16. The terminals 9 and 11 of the compressor variable gain cell 18 are connected effectively and parallel with the impedance circuit 47, for modifying the gain of the compressor operational amplifier 16.

The impedance circuit 47 includes a pair of series connected resistors 49 and 52, which are connected across the negative input and the output of the compressor operational amplifier 16. A grounded capacitor 54 is connected to the junction between the resistors 49 and 52. A capacitor 56 is connected between the negative input and the output of the compressor operational amplifier 16.

The compressor average level detector 21 includes a series connection of a capacitor 58, and resistor 60, and a resistor 62 connected between the output of the operational amplifier 16 and the terminal 13 of the compressor variable gain cell 18. A capacitor 64 is connected and parallel with the resistor 60. A capacitor 66 is connected in series with a resistor 68, and the series connection thereof extends between the output of the operational amplifier 16 and the terminal 9 of the compressor variable gain cell 18.

The capacitor 66 and the resistor 68 provide the input connection for the compressor variable gain cell 18. The resistor-capacitor network portion of the average level detector 21 cooperates with an active portion of the average level detector 21 in the same integrated circuit chip which includes the compressor variable gain cell 18. In the preferred form of the present invention, the integrated circuit chip NE572 performs both the compressor variable gain cell function, as the well active portion of the average level detector for the compressor 14. The discreet external resistor-capacitor network is used for establishing the reference level for the compressor 14, and also enhances the sound quality of the overall system.

Considering now the microphone mute circuit 23 with particular reference to FIG. 2 of the drawings, the circuit 23 is connected through a current limiting resistor 71 to the output of the compressor operational amplifier 16. The circuit 23 includes a manual switch 73, which when disposed in its open position, allows the compressed signal to flow from the output of the compressor operational amplifier 16 to the input of the pre-emphasis operational amplifier 25. In such a normal operation, a series connected capacitor 75 and a resistor 77 are connected from the resistor 71 to ground. However, when the switch 73 is closed, the resistor 77 is effectively shorted out, and thus the capacitor 75 provides a short to ground, which effectively renders the output of the compressor operational amplifier 16 inoperative.

Considering now the pre-emphasis circuit 25 in greater detail, the circuit 25 includes an operational amplifier 79, having its negative input connected through a resistor 82, through the resistor 71 to the output of the operational amplifier 16. The plus input is connected through a capacitor 84 to ground potential. The output of the operational amplifier 79 is connected through a capacitor 86 to an output terminal 88 to the RF transmitter (not shown). A battery status circuit generally indicated at 90 includes an operational amplifier 92 and a battery status indicating device 94 monitors the battery (not shown) connected across a pair of terminals 96 and 98. A switch 101 allows a battery checking operation to take place.

Considering now the limiter peak level detector 27 in greater detail with reference to FIG. 2, the peak level detector 27 includes a transistor 103, which has its emitter connected to the positive potential of the battery, and has its collector connected through a current limiting resistor 104 to the terminal 4 of the limiter variable gain cell 28. A resistor 106 is connected between the base of the transistor 103 and the positive potential.

A filter 105 of the peak level detector 27 is connected between the output of the operational amplifier 79 and the base of the transistor 103. The filter determines the reference level which is detected at the output of the pre-emphasis circuit 25, and that level is dependent upon the frequency of the signal from the circuit 25. It should be understood that the peak level reference detected by the detector 27 is, or may be, different from the reference level of the compressor 14, due to the inherent design characteristics of both the compressor 14 and pre-emphasis circuit 25.

Since the potential clipping condition may arise in either the pre-emphasis circuit 25 or the compressor 14, the level detector 27 responds to the output of the pre-emphasis circuit 25, since that output is the one which is transferred to the RF transmitter. Thus, the detector 27 and the limiter variable gain cell 28 can quickly make a correction in the event that a clipping condition arises.

The level of the peak level detector 27 is frequency dependent. In this regard, at higher frequencies, the detector 27 operates at a predetermined lower amplitude threshold reference. At lower frequencies, the detector 27 operates at a predetermined higher amplitude threshold reference. It should be noted that this difference in the frequency is inversely proportional to the reference arrangement of the pre-emphasis circuit 25.

The filter 105 includes a capacitor 108 connected between the output of the operational amplifier 79 and a resistor 110, which is connected at its other end to the base of the transistor 103. This capacitor-resistor series circuit is sensitive to the lower frequency signals at the output of the operational amplifier 79.

A capacitor 112 is connected between the base of the transistor 103 through a resistor 114 to ground. This latter capacitor-resistor network is sensitive to higher frequencies.

During normal operation, the peak level detector 27 is inoperative. However, when a clipping condition arises, the transistor 103 causes the limiter variable gain cell 28 to reduce the gain of the operational amplifier 33.

In order to connect the variable gain cell 28 in parallel with an impedance circuit 121 connected across the negative input and the output of the operational amplifier 33, a series of connected capacitor 123 and a resistor 125 provide a connection between the output of the operational amplifier 33 and a pin 7 of the variable gain cell 28. The pin 5 of the gain cell 28 is connected to the negative input of the operational amplifier 33, a resistor 127 being connected between the terminal 5 and ground.

The impedance circuit 121 is a parallel combination of a resistor 129 and a capacitor 132. Thus, the gain of the operational amplifier 33 is reduced when the limiter variable gain cell 28 becomes operational and provides an impedance which is effectively connected and parallel with the impedance circuit 121 to modify the overall impedance for controlling the gain of the operational amplifier 33.

Thus, the limiter peak level detector 27 and the limiter variable gain cell 28 respond quickly to certain predetermined threshold amplitude reference levels of the signal at the output of the pre-emphasis circuit 25, to modify the gain of the microphone amplifier 12 for reducing it in a negative feedback manner, thereby preventing the unwanted and undesirable clipping of the compressed signal sent to the RF transmitter, before the averaging level detector 21 is able to compensate for unusually high amplitude input signals. Thus, there are no undesirable and unwanted harmonic distortion generated by clipped signals. Such harmonic distortion produces a very undesirable sound quality. Due to the fast beat of the limiter peak level detector 27 and the limiter variable gain cell 28, only a very minor or soft distortion results without harmonic distortion, and at a very short interval of time. Thus, the overall sound quality of reproduction is of an extremely high level.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A clipping suppression arrangement for a compandorized communication system, comprising:
   input means for amplifying an input signal;
   means for compressing the amplified input signal to provide a compressed signal;
   wherein said compressing means includes operational amplifier means for responding to the amplified input signal, to generate said compressed signal;
   wherein said compressing means further includes variable gain means responsive to said compressed signal for controlling said operational amplifier means;
   wherein said compressing means further includes average level detector means responsive to said compressed signal for controlling the gain of said variable gain means; and
   limiter peak level detctor means responsive to said compressed signal exceeding a predetermined limit for causing the gain of said means for amplifying to be reduced, to suppress said compressed signal from clipping.

2. A clipping suppression arrangement according to claim 1, wherein said detector means includes an amplifier.

3. A clipping suppression arrangement according to claim 2, wherein said detector means includes a filter.

4. A clipping suppression arrangement according to claim 1, further including limiter varaible gain cell means responsive to said level detector means for reducing the gain of said means for amplifying.

5. In a compandorized communication system having compandor means for compressing a signal from an input amplifier having an operational amplifier means for generating the compressed signal, variable gain means for controlling said operational amplifier means, and average level detector means for controlling the gain of said variable gain means; a clipping suppression arrangement, comprising:
   input means for amplifying an input signal;
   conductor means connected to the output of said input means for supplying the amplified signal to the input of said operational amplifier means; and
   limiter peak level detector responsive to the compressed signal exceeding a predetermined limit for causing the gain of the amplifier to be reduced in a rapid manner, before said compandor means can respond within its attach interval for reducing its gain in response to the compressed signal, so as to suppress the compressed signal from clipping.

6. In a compandorized communication system, the arrangement according to claim 5, wherein said detector means includes an amplifier.

7. In a compandorized communication system, the arrangement according to claim 6, wherein said detector means includes a filter.

8. In a compandorized communication system, the arrangement according to claim 7, further including limiter variable gain cell means responsive to said level detector means for reducing the gain of said means for amplifying.

9. A clipping suppression arrangement according to claim 4, further including pre-emphasis circuit means responsive to said output compressed signal for generating an improved output signal.

10. A clipping suppression arrangement according to claim 9, further including microphone circuit means for conveying said output compressed signal to said pre-emphasis means.

11. A clipping suppression arrangement according to claim 10, wherein said means for compressing causes a two-to-one compresision of the amplified input signal.

12. A clipping suppression arrangement according to claim 11, wherein said input means includes a microphone input amplifier.

13. A clipping suppression arrangement according to claim 12, wherein said level detector means includes a series connection of a capacitor and at least one resistor connector between the output of said operational amplifier means and the output of said variable gain means.

14. A clipping suppression arrangement according to claim 13, wherein said coupling means includes a current limiting resistor for interconnecting the output of said operational amplifier means and the input of said microphone mute circuit means.

15. A clipping suppression arrangement according to claim 14, wherein said pre-emphasis circuit means includes an operational amplifier.

16. A clipping suppression arrangement according to claim 1, wherein said limiter peak level detector means includes a transistor.

17. A clipping suppression arrangement according to claim 16, wherein limiter peak level detector means further includes a filter for determining a reference level at the output of said pre-emphasis circuit means.

18. A clipping suppression arrangement according to claim 17, wherein said filter includes a capacitor.

* * * * *